United States Patent [19]

Ono

[11] Patent Number: 5,041,391
[45] Date of Patent: Aug. 20, 1991

[54] METHOD OF MANUFACTURING A PHOTOVOLTAIC DEVICE

[75] Inventor: Masayoshi Ono, Hyogo, Japan

[73] Assignee: Sanyo Electric Co., Ltd., Moriguchi, Japan

[21] Appl. No.: 434,341

[22] Filed: Nov. 8, 1989

[30] Foreign Application Priority Data

Nov. 18, 1988 [JP] Japan .............................. 63-292875
Feb. 1, 1989 [JP] Japan .................................. 1-23103

[51] Int. Cl.⁵ ........................................... H01L 31/18
[52] U.S. Cl. ........................................ 437/2; 437/4; 437/173; 437/205; 136/244; 136/249
[58] Field of Search ................................. 437/2-5, 437/51, 173, 205; 136/244, 249 MS, 258 AM

[56] References Cited

U.S. PATENT DOCUMENTS

| 4,428,110 | 1/1984 | Kim .......................................... 437/2 |
| 4,532,371 | 7/1985 | Hanak et al. ....................... 136/249 MS |
| 4,724,011 | 2/1988 | Turner et al. ..................... 136/249 MS |

FOREIGN PATENT DOCUMENTS

| 62-76786 | 4/1987 | Japan .................................. 136/244 |
| 62-89368 | 4/1987 | Japan ............................ 136/249 MS |

*Primary Examiner*—Aaron Weisstuch
*Attorney, Agent, or Firm*—W. G. Fasse; D. H. Kane, Jr.

[57] ABSTRACT

A method of manufacturing a photovoltaic device in which a plurality of photovoltaic cells are connected in series on an insulative substrate, includes the steps of: forming on said insulating substrate a plurality of first electrodes (13a, 13b, 13c; 23a, 23b, 23c) having respective first extended portions (13ae, 13be, 13ce; 23ae, 23be, 23ce) (11; 21); covering the plurality of first electrodes with a photo-active semiconductor layer (14; 24); forming a plurality of second electrodes (15a, 15b, 15c; 25a, 25b, 25c) on the semiconductor layer. The second electrodes have respective second extended portions (15ae, 15be, 15ce; 25ae, 25be, 25cd) which overlap the corresponding first extended portions, to thereby the corresponding first electrodes; series connections are formed by causing an energy beam to irradiate regions where the second extended portions overlap the first extended portions.

13 Claims, 5 Drawing Sheets

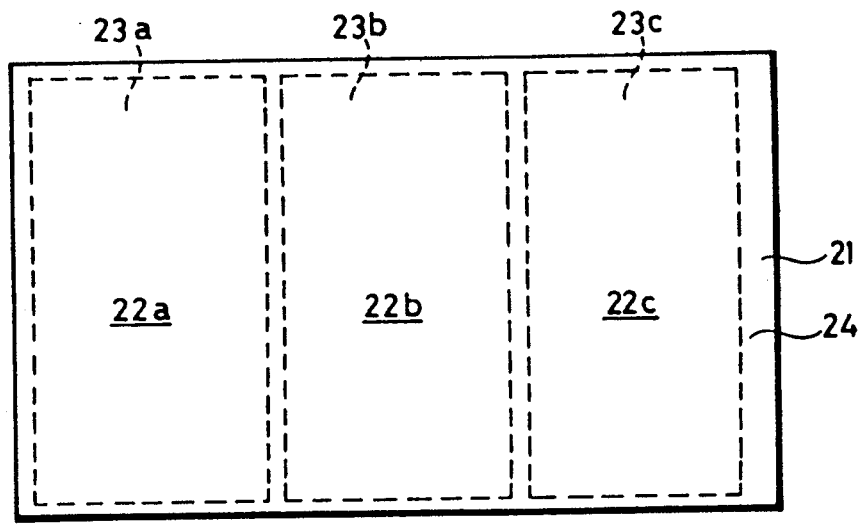
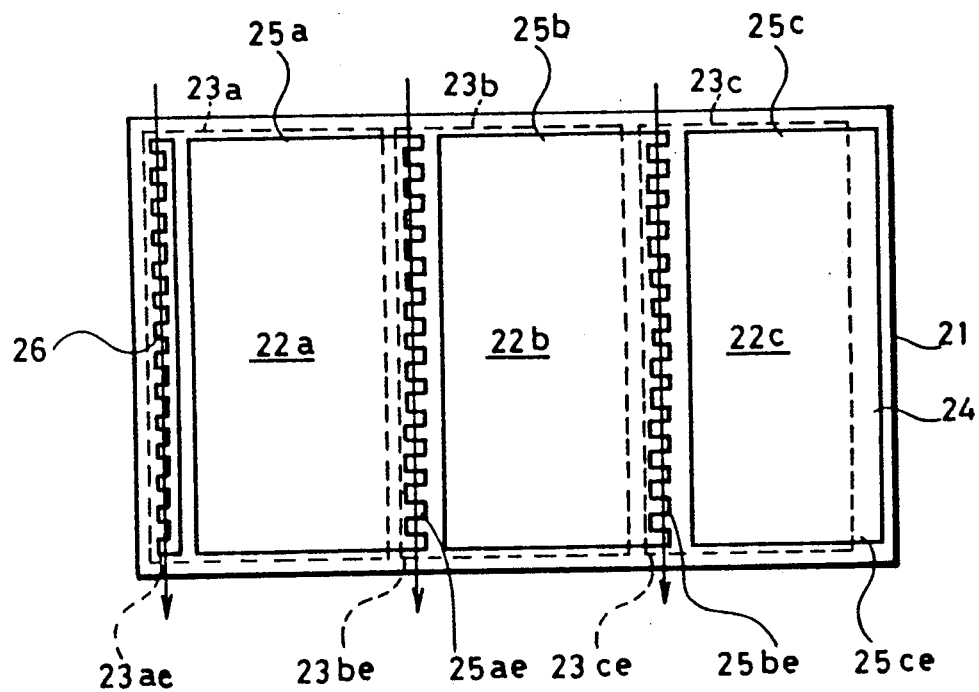

METHOD OF MANUFACTURING A PHOTOVOLTAIC DEVICE

FIELD OF THE INVENTION

The present invention relates generally to a method of manufacturing a photovoltaic device, and more particularly, to a method of manufacturing a photovoltaic device comprising a plurality of photovoltaic cells connected in series to one another, formed on a plurality of areas on one insulator substrate.

BACKGROUND INFORMATION

FIGS. 1A–1D are plan views illustrating a method of manufacturing a photovoltaic device disclosed in Japanese Patent Laying-Open No. 62-76786.

Referring to FIG. 1A, a plurality of first electrodes 3a, 3b and 3c are formed respectively on a plurality of cell areas 2a, 2b and 2c on an insulator substrate 1 of rectangular shape. The first electrodes 3a, 3b and 3c have first extended portions 3ae, 3be and 3ce for an electrical connection, respectively, along the bottom side of the substrate 1.

Referring to FIG. 1B, the first electrodes 3a, 3b and 3c are covered with a photo-active semiconductor layer 4. The semiconductor layer 4 includes a pn junction or a pin junction, parallel to the first electrodes 3a, 3b and 3c.

Referring to FIG. 1C, an energy beam such as a laser beam or an electron beam is directed onto the semiconductor layer 4 along the bottom side of the substrate to irradiate the layer 4, thereby forming a groove 4a penetrating the semiconductor layer 4. The groove 4a runs across each of the first extended portions 3ae, 3be, and 3ce. That is, a portion of each of the first extended portions 3ae, 3be and 3ce is exposed within the groove 4a.

Referring to FIG. 1D, a plurality of second electrodes 5a, 5b and 5c are formed on the semiconductor layer 4, respectively in the plurality of cell areas 2a, 2b and 2c. The second electrodes 5a, 5b and 5c have second extended portions 5ae, 5be and 5ce for an electrical connection, respectively, along the bottom side of the substrate 1. Further, a lead-out electrode 6 is formed on the semiconductor layer 4 so as to overlap the first extended portion 3ae of the first electrode 3a at the left end of the rectangular substrate.

As a result, the lead-out electrode 6 is connected through the groove 4a to the first extended portion 3ae of the first electrode 3a at the left end. Further, the second extended portion 5ae of the second electrode 5a at the left end is connected through the groove 4a to the first extended portion 3be of the first electrode 3b at the center of the substrate. Similarly, the second extended portion 5be of the second electrode 5b at the center is connected to the first extended portion 3ce of the first electrodes 3c at the right end of the substrate. That is, such a photovoltaic device is formed so that three photovoltaic cells in the respective cell areas 2a, 2b and 2c are connected in series to one another.

When light enters from the substrate side into the photo-active semiconductor layer 4, the first electrodes 3a, 3b and 3c made of a transparent conductive oxide (TCO) are formed on the transparent insulator substrate 1. On the other hand, when light enters from the opposite side into the semiconductor layer 4, the second electrodes 5a, 5b and 5c are formed of the TCO.

In the described method of manufacturing the photovoltaic device of the prior art, when the groove 4a is formed by an energy beam, there is a danger that particles of the semiconductor scatter and then remain on the semiconductor layer 4. The semiconductor particles sandwiched between the semiconductor layer 4 and the second electrodes 5a, 5b and 5c exert an adverse effect on the characteristics of the photovoltaic device.

Further, the semiconductor layer 4 is exposed to its surroundings for a long period of time, in the step of forming the groove 4a by the laser beam. Consequently, there is a danger that the surface of the semiconductor layer 4 is oxidized, absorbs water or is contaminated by dust, fats and oils or the like. The resultant oxide film, water, contamination and the like on the surface of the semiconductor layer 4 have an adverse effect not only on the electric characteristics of the photovoltaic device but also on the electrical contact between the second electrodes 5a, 5b and 5c and the semiconductor layer 4.

Moreover, since the respective first extended portions 3ae, 3be and 3ce of the first electrodes 3a, 3b and 3c are exposed in the formed groove 4a, those exposed portions are liable to be contaminated before formation of the second electrodes 5a, 5b and 5c.

SUMMARY OF THE INVENTION

In view of the above described prior art, it is an object of the present invention to provide a method of manufacturing a photovoltaic device in which a surface of a semiconductor layer and connecting portions of electrodes are less liable to be contaminated.

According to the present invention, a method of manufacturing the photovoltaic device in which a plurality of photovoltaic cells are connected in series on one insulator substrate, comprises the steps of: forming a plurality of first electrodes on a plurality of cell areas on the insulator substrate, the first electrodes having first extended portions, respectively, so as to enable the formation of series connections; covering the plurality of first electrodes with a photo-active semiconductor layer; forming a plurality of second electrodes in the plurality of cell areas on the semiconductor layer, the second electrodes having second extended portions, respectively, at least portions of which overlap the corresponding first extended portions so as to enable series connections; and forming the series connections by directing an energy beam on regions where the second extended portions overlap the first extended portions for irradiating said overlap.

Therefore, according to the method of the present invention, since the second electrodes can be formed immediately after the formation of the semiconductor layer, oxidation and contamination of the surface of the semiconductor layer can be minimized. Further, since the second electrodes are already formed during the irradiation of the energy beam, no scattered semiconductor particles are sandwiched between the semiconductor layer and the second electrodes. Moreover, since none of the first extended portions are exposed in a groove formed in the semiconductor layer, there is no contamination of the first extended portions due to the exposure.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 3A-3C are plan views illustrating another embodiment of the present invention.

DESCRIPTION OF THE PREFERRED EMBODIMENTS AND OF THE BEST MODE OF THE INVENTION

Figure 1A:
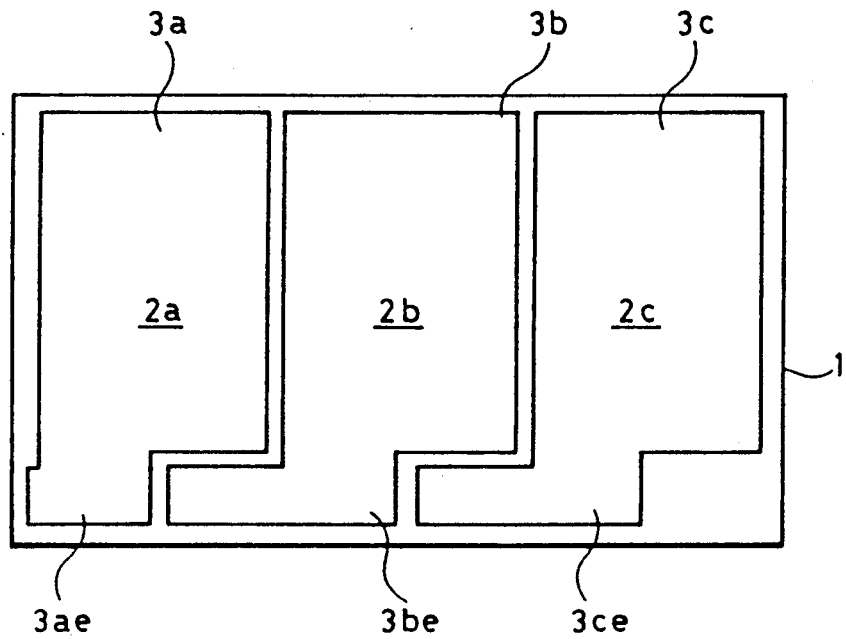
FIG. 1A-1D are plan views illustrating a method of manufacturing a photovoltaic device of the prior art.
Figure 1B:
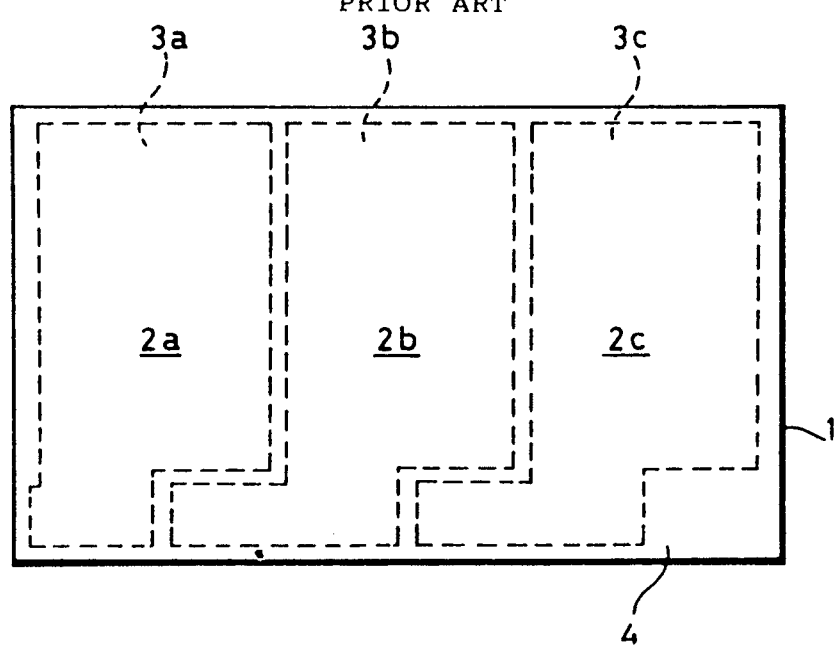
Figure 1C:
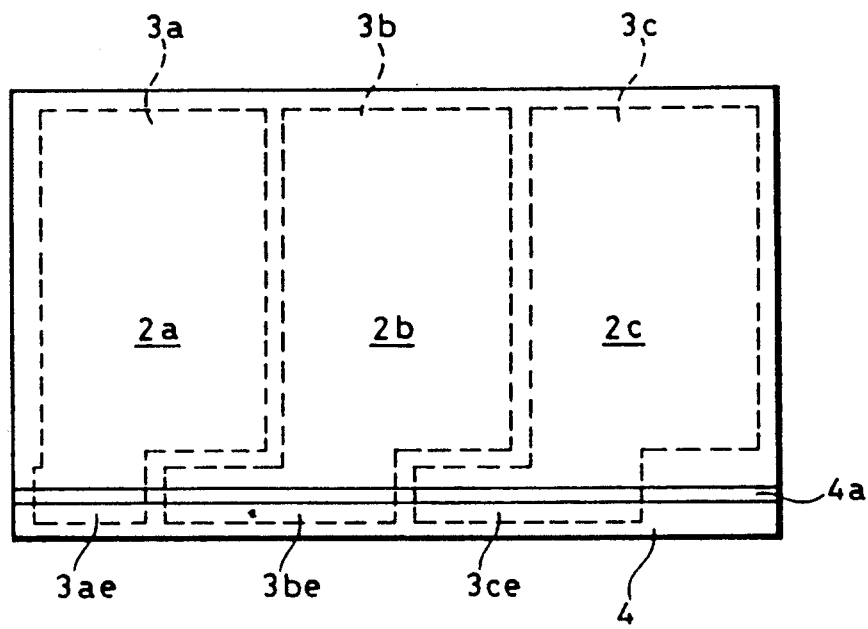
Figure 1D:
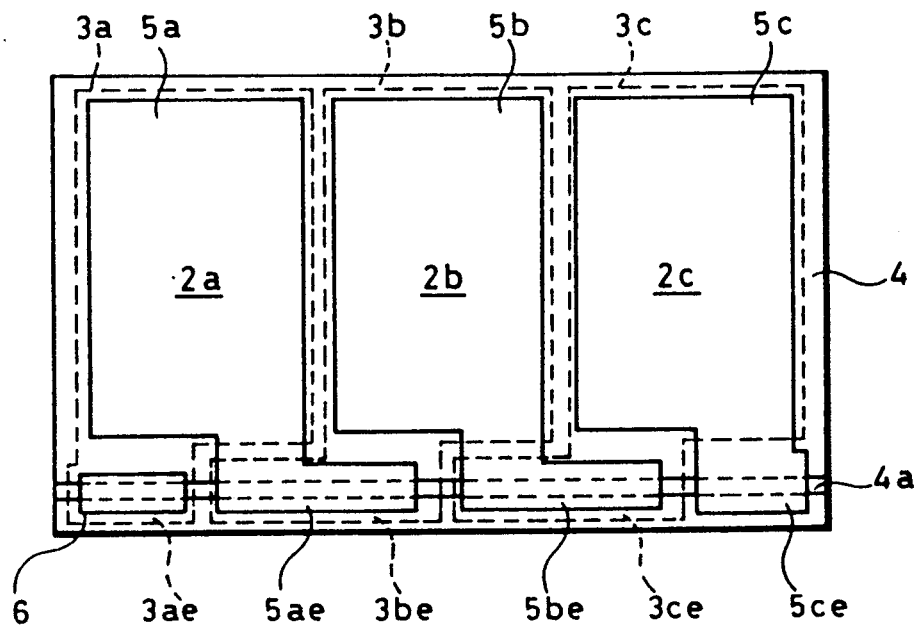
Figure 2A:
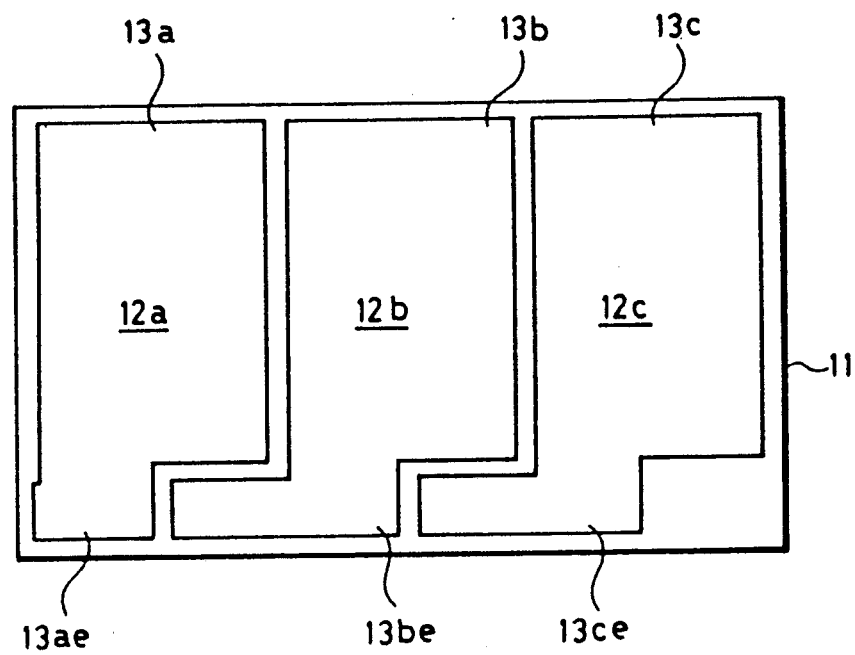
FIGS. 2A-2C are plan views illustrating a method of manufacturing a photovoltaic device according to one embodiment of the present invention.
Figure 2B:
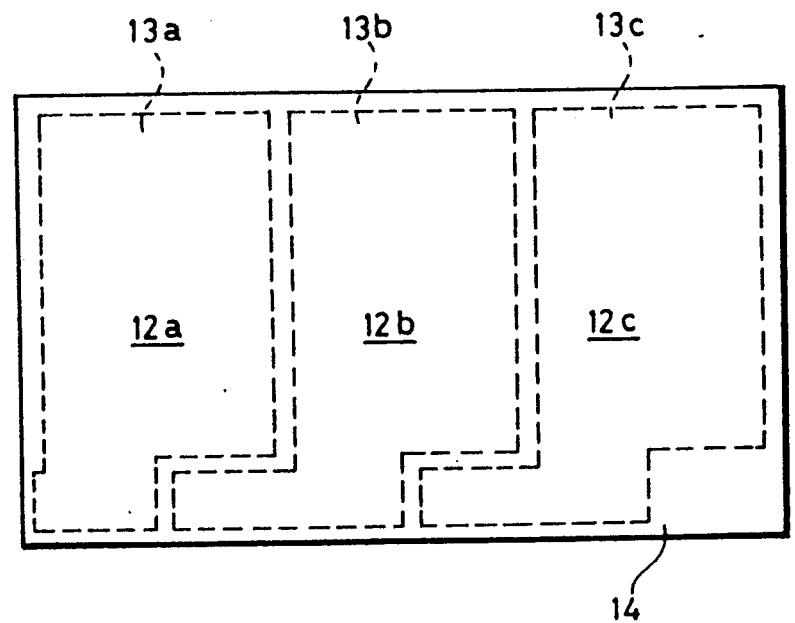
Figure 2C:
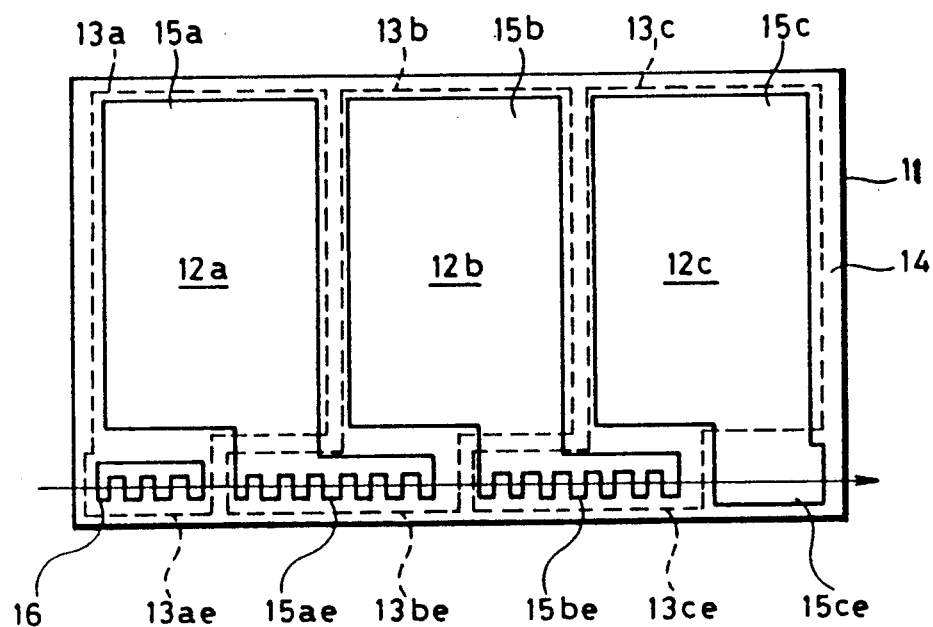

FIGS. 2A-2C illustrate a method of manufacturing a photovoltaic device, according to one embodiment of the present invention, in which a plurality of photovoltaic cells are connected in series on one insulator substrate.

Referring to FIG. 2A, a transparent insulator substrate 11 made of glass or a heat-resistive plastic material is prepared. The substrate 11 is, for example, rectangular, by. A plurality of first electrodes 13a, 13b and 13c are formed respectively on a plurality of cell areas 12a, 12b and 12c arranged in a longitudinal direction. The first electrodes 13a, 13b and 13c have respective first extended portions 13ae, 13be and 13ce for forming electrical connections along the bottom side of the substrate 11. The first extended portion 13be of the first electrode 13b at the center has a reversed L-shape and extends into the cell area 12a at the left end with a width of approximately 0.3 mm. Similarly, the first extended portion 13ce of the first electrode 13c at the right end extends into the central cell area 12b. The first electrodes 13a, 13b and 13c are formed of a single layer or a multi-layer of a TCO such as a tin oxide ($SnO_2$) or an indium tin oxide (ITO).

Referring to FIG. 2B, the first electrodes 13a, 13b and 13c are covered with a photo-active semiconductor layer 14. The semiconductor layer 14 can be formed by depositing amorphous silicon (a-Si), amorphous silicon carbide (a-SiC), amorphous silicon germanium (a-SiGe) and/or the like, by plasma CVD (Chemical Vapor Deposition) or photo CVD employing a gas including a silicon compound such as $SiH_4$, $SiF_4$. A pn junction or a pin junction parallel to the first electrodes 13a, 13b and 13c is formed in the semiconductor layer 4.

Referring to FIG. 2C, second electrodes 15a, 15b and 15c are formed respectively in the cell areas 12a, 12b and 12c, and the second electrodes 15a, 15b and 15c overlap the first electrodes 13a, 13b and 13c, respectively. The second electrodes 15a, 15b and 15c have respective second extended portions 15ae, 15be and 15ce for making electrical connections, along the bottom side of the substrate 11. The second extended portion 15ae of the second electrode 15a at the left end extends into the central cell area 12b and overlaps the first extended portion 13be of the first electrode 13b. The second extended portion 15ae has a smaller size than the first extended portion 13be and is formed in a comb shape. Similarly, the second extended portion 15be of the central second electrode 15b overlaps the first extended portion 13ce of the first electrode 13c in the cell area 12c at the right end. Further, a lead-out electrode 16 of a comb shape is formed to overlap the first extended portion 13ae of the first electrode 13a in the cell area 12a at the left end. The lead-out electrode 16 is also formed to be smaller in size than the first extended portion 13ae.

The second electrodes 15a, 15b and 15c and the lead-out electrode 16 can be formed by drying a pattern of a conductive paste printed by a screen process, at about 150° C. The conductive paste can include, as a filler Ag, Ni, Cu and/or the like, and, as a binder, phenol, epoxy, polyester and/or the like. Further, the second electrodes 15a, 15b and 15c may be patterns of a metal layer formed such as by evaporation or plating. For such patterns of the metal layer, there can be employed Al, Ti, Ni, TiAg or the like.

Finally, three voltaic cells in the respective cell areas 12a, 12b and 12c are electrically connected in series by scanning with an energy beam such as a laser beam or an electron beam so that the beam runs across the lead-out electrode 16 and the second extended portions 15ae and 15be along the bottom side of the substrate 1, as shown by the arrow in FIG. 2C. That is, portions of the semiconductor layer 14 in regions irradiated with the energy beam are removed, and at the same time, the lead-out electrode 16 is welded to the first extended portion 13ae of the first electrode 13a at the left end. Similarly, the second extended portion 15ae of the second electrode 15a at the left end is welded to the first extended portion 13be of the central first electrode 13b, and the second extended portion 15be of the central second electrode 15b is welded to the first extended portion 13ce of the first electrode 13c at the right end. The pattern formed by screen printing the conductive paste is thinner at its edge portions than in the inner area, which facilitates the welding. When the lead-out electrode 16 and the second extended portions 15ae and 15be are thick, i.e., for example, when they are made of a conductive paste printed by the screen process, they inevitably become thick in their inner areas, but still remain thinner along their edges as mentioned above. Due to the thicker inner areas an energy beam having a high energy is required to melt these electrodes and extended portions. Thus it is preferred that the lead-out electrode 16 and the second extended portions 15ae and 15be are formed in a comb shape, and thus the energy beam is driven to scan across the teeth of those combs. This operation ensures that the lead-out electrode 16 and the second extended portions 15ae and 15be are melted at least at both edges of the teeth of each comb. Preferably, a Q-switched Nd-YAG laser device may be employed as a source of the energy beam.

In the photovoltaic device of FIG. 2C including the plurality of cells connected in series, an output power can be obtained between the lead-out electrode 16 and the second extended portion 15ce of the second electrode 15c at the right end.

Figure 3A:
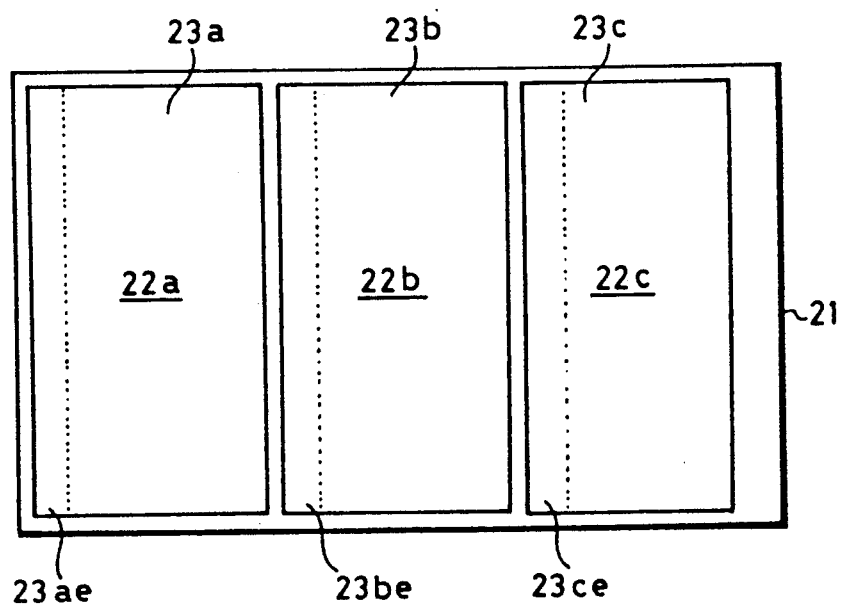

FIGS. 3A-3C illustrate another embodiment of the present invention.

Referring to FIG. 3A, a plurality of first electrodes 23a, 23b and 23c, which are formed respectively on a plurality of cell areas 22a, 22b and 22c on a substrate 21, have first extended portions 23ae, 23be and 23ce along their respective left sides.

Referring to FIG. 3B, the first electrodes 23a, 23b and 23c are covered with a semiconductor layer 24.

Referring to FIG. 3C, the second electrodes 25a, 25b and 25c are formed on the semiconductor layer 24 respectively in the plurality of cell areas 22a, 22b and 22c. The second electrodes 25a, 25b and 25c have second extended portions 25ae, 25be and 25ce along their respective right sides. The second extended portion 25ae of the second electrode 25a at the left end is formed in a comb shape and overlaps the first extended portion 23be of the first electrode 23b at the center. Similarly, the second extended portion 25be of the central second electrode 25b overlaps the first extended portion 23ce of the first electrode 23c at the right end. Further, a lead-out electrode 26 of a comb shape is formed overlapping the first extended portion 23ae of the first electrode 23a at the left end.

Finally, as shown by the arrows in FIG. 3C, the energy beam is caused to scan across the teeth of the combs of the lead-out electrode 26 and the second extended portions 25ae and 25be. Accordingly, three photovoltaic cells in the respective cell areas 22a, 22b and 22c are connected in series with one another.

As has been described above, since the second electrodes can be formed immediately after the formation of the semiconductor layer according to the method of the present invention, an oxidation or contamination of the surface of the semiconductor layer can be minimized. Furthermore, since the second electrodes are already formed during the irradiation with the energy beam, scattered semiconductor particles are not sandwiched between the semiconductor layer and the second electrodes. In addition, since none of the first extended portions is exposed in the groove formed in the semiconductor layer, there is no possibility that the first extended portions are contaminated by the exposure.

The above description of the method of manufacturing a photovoltaic device describes the formation of three photovoltaic cells connected in series. However, the present invention is also applicable to a method of manufacturing a photovoltaic device in which any desired number of photovoltaic cells are connected in series.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a photovoltaic device in which a plurality of photovoltaic cells are connected in series on an insulative substrate, comprising the steps of: forming a plurality of first electrodes (13a, 13b, 13c; 23a, 23b, 23c) on a plurality of cell areas (12a, 12b, 12c; 22a, 22b, 22c) on said insulative substrate (11; 21), said first electrodes each having first extended portions (13ae, 13be, 13ce; 23ae, 23be, 23ce), so as to enable said series connections; covering said plurality of first electrodes with a photo-active semiconductor layer (14; 24); forming second electrodes (15a, 15b, 15c; 25a, 25b, 25c) on said semiconductor layer in each of said plurality of cell areas, said second electrodes each having second extended portions which are thinner along edges than in an inner area of said second extended portions (15ae, 15be, 15ce; 25ae, 25be, 25ce), wherein at least parts of said second extended portions overlap the corresponding first extended portions so as to enable said series connections; and forming said series connections by causing an energy beam to scan and irradiate at least said thinner edges where said second extended portions overlap said first extended portions.

2. The method of claim 1, wherein said second extended portions respectively comprises comb-shaped sections along said thinner edges overlapping said first extended portions, and wherein said energy beam is caused to scan across a plurality of teeth of said comb-shaped sections.

3. The method of claim 1, wherein said second electrodes are formed by evaporation.

4. The method of claim 1, wherein said energy beam a laser beam.

5. The method of claim 4, wherein a source of said laser beam is a Q-switched Nd-YAG laser device.

6. The method of claim 1, wherein said energy beam comprises an electron beam.

7. The method of claim 1, wherein said second electrodes are formed by printing a conductive paste by a screen process.

8. A method of manufacturing a photovoltaic device in which a plurality of photovoltaic cells are connected in series on an insulative substrate, comprising the steps of: forming a plurality of first electrodes (13a, 13b, 13c; 23a, 23b, 23c) on a plurality of cell areas (12a, 12b, 12c; 22a, 22b, 22c) on said insulative substrate (11; 21), said first electrodes each having first extended portions (13ae, 13be, 13ce; 23ae, 23be, 23ce), so as to enable said series connections; covering said plurality of first electrodes with a photo-active semiconductor layer (14; 24); forming second electrodes (15a, 15b, 15c; 25a, 25b, 25c) on said semiconductor layer in each of said plurality of cell areas, said second electrodes each having second extended portions having comb-shaped sections (15ae, 15be, 15ce; 25ae, 25be, 25ce), wherein at least parts of said second extended portions overlap the corresponding first extended portions so as to enable said series connections; and forming said series connections by causing an energy beam to scan and irradiate a plurality of teeth of said comb-shaped sections where said second extended portions overlap said first extended portions.

9. The method of claim 8, wherein said second electrodes are formed by printing a conductive paste by a screen process.

10. The method of claim 9, wherein said second electrodes are formed by evaporation.

11. The method of claim 9, wherein said energy beam comprises a laser beam.

12. The method of claim 11, wherein said laser beam is a Q-switched Nd-YAG laser device.

13. The method of claim 9, wherein said energy beam comprises an electron beam.

* * * * *

UNITED STATES PATENT AND TRADEMARK OFFICE
CERTIFICATE OF CORRECTION

PATENT NO. : 5,041,391
DATED : August 20, 1991
INVENTOR(S) : Masayoshi Ono

It is certified that error appears in the above-identified patent and that said Letters Patent is hereby corrected as shown below:

line 7, delete "(11; 21)";

line 14, replace "; series" by --. Series--.

Claim 2, (col. 6, line 8) replace "comprises" by --comprise--.
Claim 4, (col. 6, line 15) after "beam" insert --comprises--.

Signed and Sealed this

Third Day of November, 1992

*Attest:*

DOUGLAS B. COMER

*Attesting Officer*      *Acting Commissioner of Patents and Trademarks*

UNITED STATES PATENT AND TRADEMARK OFFICE
CERTIFICATE OF CORRECTION

PATENT NO. : 5,041,391

DATED : August 20, 1991

INVENTOR(S) : Masayoshi Ono

It is certified that error appears in the above-identified patent and that said Letters Patent is hereby corrected as shown below:

On the Title page

Item [57] Abstract, line 4, replace "insulating" by --insulative--;

Signed and Sealed this

Twenty-third Day of February, 1993

*Attest:*

STEPHEN G. KUNIN

*Attesting Officer*     *Acting Commissioner of Patents and Trademarks*